US012645269B2

(12) United States Patent
Chang

(10) Patent No.: US 12,645,269 B2
(45) Date of Patent: Jun. 2, 2026

(54) DISK ARRAY ENCLOSURE HAVING LINKAGE STRUCTURE FOR OPENING DOOR COVERS WITHOUT INTERFERENCE

(71) Applicant: U' RACK ENTERPRISE CO., LTD., New Taipei City (TW)

(72) Inventor: Yung-Chang Chang, New Taipei City (TW)

(73) Assignee: U' RACK ENTERPRISE CO., LTD., New Taipei City (TW)

( * ) Notice: Subject to any disclaimer, the term of this patent is extended or adjusted under 35 U.S.C. 154(b) by 112 days.

(21) Appl. No.: 18/779,118

(22) Filed: Jul. 22, 2024

(65) Prior Publication Data

US 2026/0023415 A1     Jan. 22, 2026

(51) Int. Cl.
| | | |
|---|---|---|
| *G06F 1/18* | (2026.01) | |
| *G06F 1/187* | (2026.01) | |
| *H05K 7/00* | (2006.01) | |
| *H05K 7/14* | (2006.01) | |

(52) U.S. Cl.
CPC ........... *G06F 1/187* (2013.01); *H05K 7/1489* (2013.01)

(58) Field of Classification Search
CPC .............................. G06F 1/187; H05K 7/1489
See application file for complete search history.

(56) References Cited

U.S. PATENT DOCUMENTS

| | | | | |
|---|---|---|---|---|
| 5,277,615 | A | * | 1/1994 | Hastings .............. G11B 33/126 |
| 5,499,925 | A | * | 3/1996 | Lwee ..................... G06K 13/08 |
| | | | | 439/157 |
| 6,036,514 | A | * | 3/2000 | Nishioka ................ G06K 13/08 |
| | | | | 439/159 |
| 6,186,804 | B1 | * | 2/2001 | Smith ................... H05K 7/1411 |
| | | | | 439/157 |
| 6,210,188 | B1 | * | 4/2001 | Chang ................ G06K 13/0806 |
| | | | | 439/159 |
| 6,351,379 | B1 | * | 2/2002 | Cheng .................. G11B 33/128 |
| 6,430,147 | B1 | * | 8/2002 | Goto .................. G11B 23/0316 |
| | | | | 720/720 |
| 6,606,256 | B1 | * | 8/2003 | Lee .......................... G06F 1/187 |
| | | | | 361/728 |
| 6,948,956 | B2 | * | 9/2005 | Ngo .................... G06K 13/0825 |
| | | | | 439/157 |
| 6,978,903 | B2 | * | 12/2005 | Son ........................ G06F 1/1656 |
| | | | | 211/26 |
| 7,345,869 | B2 | * | 3/2008 | Hsiao ...................... G06F 1/184 |
| | | | | 361/679.01 |

(Continued)

*Primary Examiner* — Rockshana D Chowdhury
(74) *Attorney, Agent, or Firm* — Fei-Hung Yang

(57) ABSTRACT

A disk array enclosure includes hard disk accommodating structures, a retaining member, door covers, and connecting rod assemblies. The hard disk accommodating structures are arranged side by side and each have a front opening, a rear opening and a connecting side portion. Each door cover corresponds in position to the front opening. One end of the door cover is pivotally connected to the connecting side portion. The connecting rod assembly includes a first rod and a second rod. When the door cover is opened, the first rod the second rod are moved such that the door cover is flush with the connecting side portion, thereby preventing interference with another adjacent door cover. When the disk array enclosure is installed inside a casing, the door covers won't hit the casing after they are opened, thereby improving the convenience of removing the hard disks greatly.

12 Claims, 4 Drawing Sheets

(56) References Cited

U.S. PATENT DOCUMENTS

| | | | | |
|---|---|---|---|---|
| 8,717,753 B2 * | 5/2014 | Keffeler | .............. | H05K 5/0221 |
| | | | | 29/830 |
| 8,730,661 B2 * | 5/2014 | Lai | ......................... | G11B 33/08 |
| | | | | 361/679.33 |
| 8,837,136 B2 * | 9/2014 | Hu | ...................... | G11B 33/124 |
| | | | | 248/220.21 |
| 8,917,518 B2 * | 12/2014 | Hu | ......................... | G06F 1/187 |
| | | | | 361/755 |
| 8,991,950 B2 * | 3/2015 | Privitera | ............. | H05K 5/0295 |
| | | | | 312/309 |
| 9,042,094 B2 * | 5/2015 | Williams | ............. | H05K 7/1461 |
| | | | | 361/679.37 |
| 9,226,425 B2 * | 12/2015 | Hsu | ...................... | H05K 7/1488 |
| 9,253,914 B2 * | 2/2016 | Demange | ............. | H05K 7/1409 |
| 9,395,769 B2 * | 7/2016 | Tu | ........................... | G06F 1/187 |
| 9,406,345 B2 * | 8/2016 | Yang | ................... | G11B 33/124 |
| 9,823,714 B2 * | 11/2017 | Yang | ................... | G11B 33/128 |
| 9,930,804 B2 * | 3/2018 | Lu | ......................... | H05K 7/1489 |
| 9,992,904 B2 * | 6/2018 | Chen | ...................... | G06F 1/187 |
| 10,111,354 B2 * | 10/2018 | Hu | ........................... | H05K 7/14 |
| 10,206,302 B2 * | 2/2019 | Liao | ........................ | G06F 1/183 |
| 10,321,597 B2 * | 6/2019 | Tseng | .................. | H05K 7/1411 |
| 10,354,699 B1 * | 7/2019 | Gopalakrishna | ........ | G06F 1/181 |
| 11,058,024 B2 * | 7/2021 | Yu | ......................... | G11B 33/127 |
| 11,229,140 B2 * | 1/2022 | Choyikkunnil | ...... | G11B 33/128 |
| 11,489,274 B2 * | 11/2022 | Wang | .................. | H05K 7/1489 |
| 11,683,906 B2 * | 6/2023 | Lin | ........................ | H05K 5/023 |
| | | | | 361/679.01 |
| 2017/0228000 A1 * | 8/2017 | Yang | ................... | G11B 33/128 |
| 2020/0183466 A1 * | 6/2020 | Chen | ...................... | G06F 1/187 |

* cited by examiner

DISK ARRAY ENCLOSURE HAVING LINKAGE STRUCTURE FOR OPENING DOOR COVERS WITHOUT INTERFERENCE

BACKGROUND OF THE INVENTION

1. Field of the Invention

The present invention relates to the field of computer equipment, and more particularly to a disk array enclosure that provides excellent convenience in taking multiple hard disks simultaneously without interfering with each other.

2. Description of the Related Art

A hard disk is a data storage device. Many related peripheral products are developed on the market to make the hard disk more stable in operation and to achieve the purpose of mutual information transmission with other components in the computer. In the case of a large computing computer or server with multiple hard disks, for example, it is common to install a disk array enclosure having multiple hard disks inside a casing.

Disk array enclosures for servers have multiple mounting slots for placement of hard disks. The hard disks are generally arranged side by side. For a conventional disk array enclosure, only one of the mounting slots can be opened at a time when in use. The reason for this is that when the slot door of any mounting slot is opened, the slot door will block the neighboring slot door. Therefore, after the placement or removal of a hard disk in any mounting slot is completed and the slot door is closed, another slot door is opened to perform the relevant action. This makes it inconvenient to place or remove the hard disks. Besides, in such a structure, the opening of the slot door on the side may be affected by the casing, which may even cause a problem of not being able to open the slot door. This causes the side mounting slot actually not being used at all, or the host needs to be enlarged to allow the side mounting slot to be located at a certain distance from the casing. These are the many problems with the use of existing disk array enclosures.

Accordingly, the inventor of the present invention has devoted himself based on his many years of practical experiences to solve these problems.

SUMMARY OF THE INVENTION

The primary objective of the present invention is to provide a disk array enclosure, which utilizes a special linkage structure so that the door covers of hard disk accommodating structures do not interfere with each other when they are opened, thus enhancing the convenience of placing or removing hard disks.

In order to achieve the aforementioned and other objectives, the present invention provides a disk array enclosure, comprising: a plurality of hard disk accommodating structures for accommodating hard disks, the hard disk accommodating structures being arranged side by side, the hard disk accommodating structures each having a front opening, a rear opening and a connecting side portion, the connecting side portion being located on one side of the front opening and the rear opening; a retaining member, mounted to one side of the hard disk accommodating structures and corresponding in position to the rear openings of the hard disk accommodating structures; a plurality of door covers, corresponding to the front openings of the respective hard disk accommodating structures, wherein one end of the door cover is pivotally connected to the connecting side portion so that the door cover is pivotable relative to the connecting side portion, and a top side of the door cover has a slide hole, preferably, the slide hole is a curved through hole extending from the door cover towards the connecting side portion; and a plurality of connecting rod assemblies, disposed in the respective hard disk accommodating structures and each including a first rod and a second rod, the first rod having a first end that is movably disposed in the slide hole and a second end that extends towards the retaining member and has a pushing member, the second rod having a first end that is pivotally connected to the first rod and a second end that is pivotally connected to the connecting side portion; wherein when the door cover is opened, the first end of the first rod is moved outwardly along the slide hole in response to movement of the door cover, and the pushing member at the second end of the first rod is simultaneously moved outwardly, and the second rod is pivoted in response to movement of the first rod, and the door cover is flush with the connecting side portion when the first end of the first rod is moved to one end of the slide hole. By moving one end of a first rod along a slide hole of a door cover, the door cover can be kept flush with a connecting side portion when it is fully opened, without interfering with another adjacent door cover, thereby allowing multiple hard disks to be placed or removed at the same time. Based on this structural feature, the door cover can be opened effectively even when the disk array enclosure is in close proximity to the casing of the host.

Preferably, the slide hole is defined in an extension portion on a top side of the door cover. The extension portion extends from an edge of the door cover, so that the door cover has a better structure, a connecting rod assembly can act exactly on a top side of hard disk accommodating structures to minimize interference with hard disks.

Preferably, the first rod has a first section and a second section that are arranged in sequence, the first section has one end movably disposed in the slide hole and another end having a first curved portion that is concave; the second section has one end provided with the pushing member and another end having a second curved portion that is convex, the second curved portion is connected to the first curved portion, and the first end of the second rod is pivotally connected to a junction of the first curved portion and the second curved portion, this allows the action of the connecting rod assembly to be more stable and the displacement of a pushing member to be more appropriate.

Preferably, a retaining member is formed with a plurality of first perforations, improving a heat dissipation effect. Similarly, the door cover is formed with a plurality of second perforations, further improving a heat dissipation effect.

Preferably, the first perforations and the second perforations are arranged in a staggered manner, in addition to having a better heat dissipation effect, the production is easier, and the retaining member and the door cover have better rigidity.

Preferably, the retaining member has a first plate portion, a second plate portion and a third plate portion, the first plate portion and the third plate portion are vertically connected to two opposite sides of the second plate portion respectively, the second plate portion corresponds in position to the rear openings of the hard disk accommodating structures, the first plate portion corresponds in position to top sides of the hard disk accommodating structures, and the third plate portion corresponds in position to bottom sides of the hard disk accommodating structures, this improves the overall structural rigidity and stability of the disk array enclosure.

Preferably, the second plate portion and the third plate portion are partially formed with the first perforation holes, so that the disk array enclosure has a better heat dissipation effect.

Preferably, the first plate portion has a plurality of notches each corresponding in position to the second end of the first rod that has the pushing member, so that the disk array enclosure can achieve a limiting and aligning effect.

Preferably, the hard disk accommodating structures each have a connection port close to the rear opening, and the pushing member is located at a center of the connection port when the door cover is in a closed state, this makes it easier to disengage the hard disk from a connection port, and reduce the chance of damage to the connection port of the hard disk due to uneven stresses on the hard disk.

Preferably, the disk array enclosure further includes a top plate provided on a top side of the hard disk accommodating structures, the top plate has a plurality of connecting portions for connecting the connecting side portions of the hard disk accommodating structures, so that the overall structure is more stable.

Preferably, the door cover has a mounting portion and a switching element, the switching element is disposed on the mounting portion via a pivot, one end of the switching element has a locking rib, another end of the switching element has a pulling portion, the hard disk accommodating structures each have a locking hole corresponding to the locking rib; when the door cover is closed to cover the front opening, the locking rib is locked in the locking hole; when the pulling portion is pulled to move the switching element outwardly, the switching element is rotated about the pivot as a rotation fulcrum to disengage the locking rib from the locking hole, this provides ease of operation.

In summary, the disk array enclosure provided by the present invention, through the special structure of the connecting rod assembly, allows the door cover not to interfere with the neighboring door covers when the door cover is opened, such that multiple door covers can be opened at the same time for placement or removal of the hard disks, improving convenience of use greatly. With this structure, the present invention can avoid the problem that the door cover located at the side of the disk array enclosure hits the casing or cannot be fully opened due to its close proximity to the casing. This also helps reduce the space required for the casing and allows the disk array enclosure to be better configured within the casing.

Regarding the further technical features of the present invention, the present invention also provides many examples and functional explanations, as described in the preceding paragraphs.

DETAILED DESCRIPTION OF THE PREFERRED EMBODIMENTS

Figure 1:
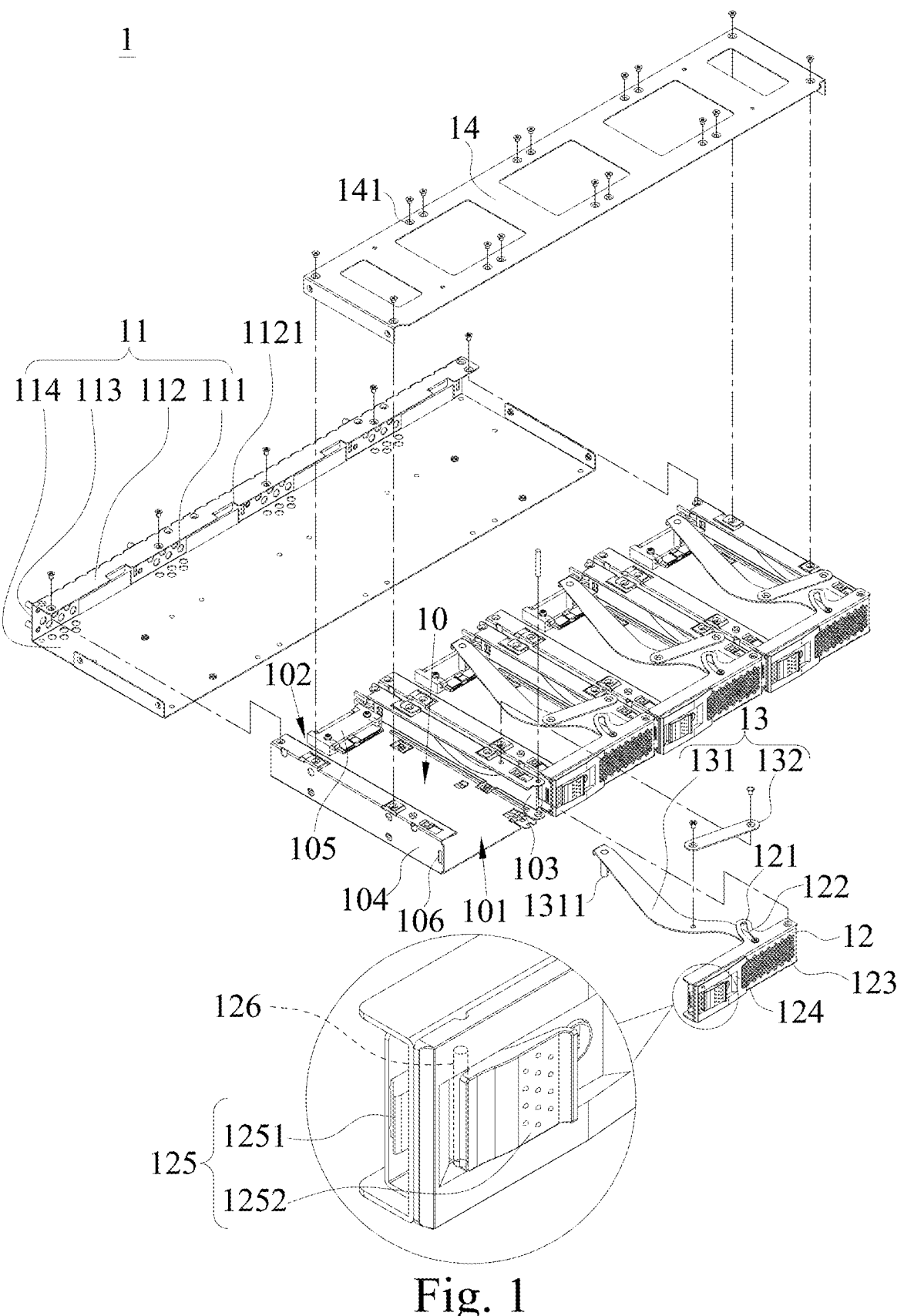
FIG. 1 is a partially exploded view of a disk array enclosure according to a preferred embodiment of the present invention.
Figure 2:
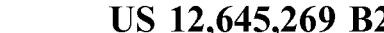
FIG. 2 is a perspective view of the disk array enclosure according to the preferred embodiment of the present invention.
Figure 3:
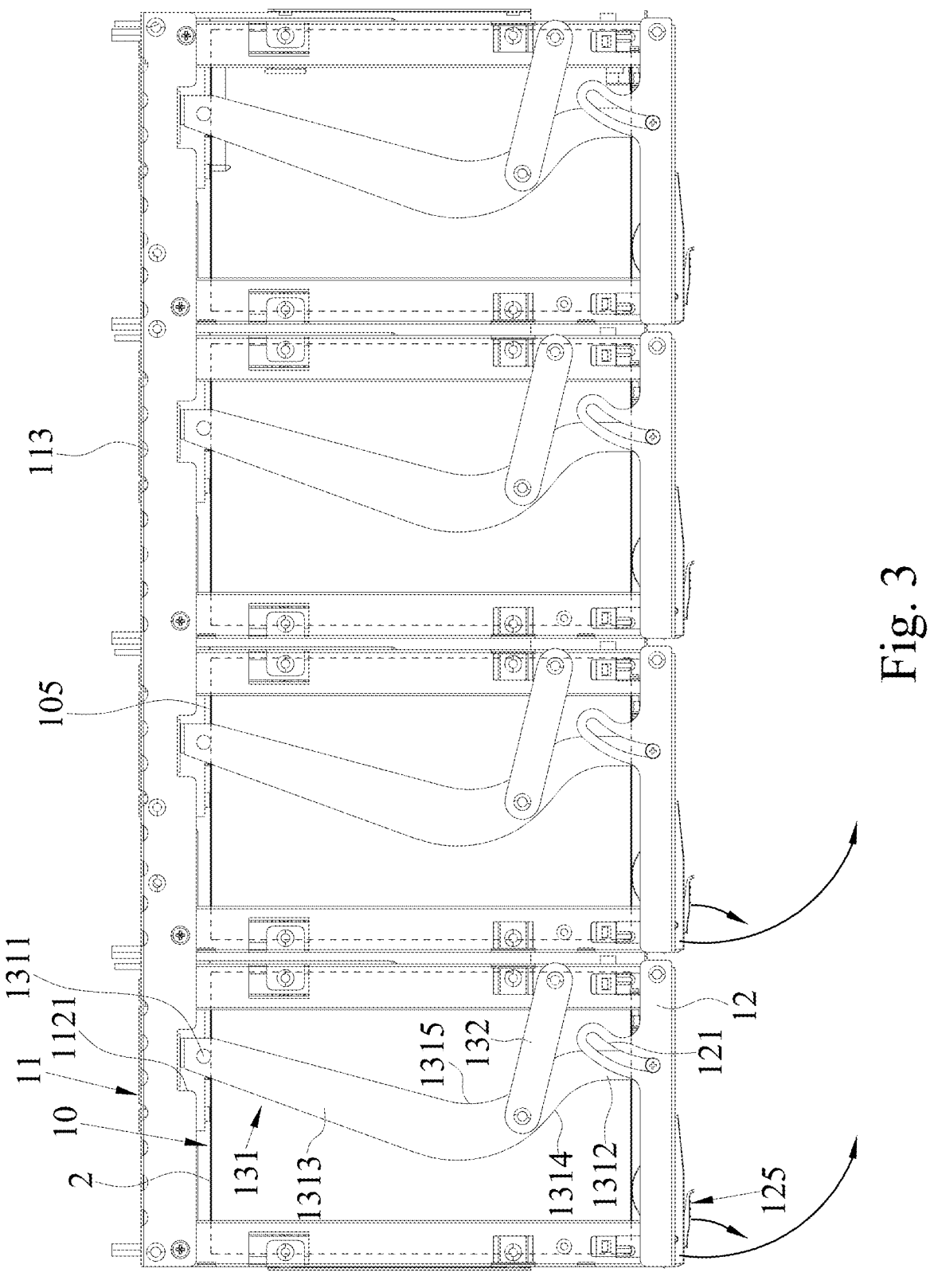
FIG. 3 is a first schematic view of the disk array enclosure according to the preferred embodiment of the present invention when in use.

The above and other objects, features and advantages of this disclosure will become apparent from the following detailed description taken with the accompanying drawings.

FIGS. 1 to 4 are a partially exploded view, a perspective view and schematic views of a disk array enclosure according to a preferred embodiment of the present invention. The present invention discloses a disk array enclosure 1, which is installed, for example, in a server for holding hard disks 2. The disk array enclosure 1 comprises a plurality of hard disk accommodating structures 10, a retaining member 11, a plurality of door covers 12, and a plurality of connecting rod assemblies 13.

The hard disk accommodating structures 10 are configured for accommodating the hard disks 2. The hard disk accommodating structures 10 are arranged side by side. The hard disk accommodating structures 10 each have a front opening 101, a rear opening 102, and a connecting side portion 103. The connecting side portion 103 is located on one side of the front opening 101 and the rear opening 102. More specifically, the hard disk accommodating structures 10 are made of, for example, metal materials and have accommodating spaces therein. The hard disk accommodating structures 10 each further have a corresponding retaining portion 104 opposite the connecting side portion 103, so as to make the accommodating space more complete and to have a better retaining effect for the hard disks 2. Furthermore, the hard disk accommodating structures 10 each have a connection port 105 for connection of the corresponding hard disk 2 after being placed in the corresponding accommodating space.

The retaining member 11 is mounted to one side of the hard disk accommodating structures 10 and corresponds in position to the rear openings 102 of the hard disk accommodating structures 10. One side of the retaining member 11, facing the rear openings 102, is provided with circuit components such as circuit boards (not shown in the figures) . The retaining member 11 may have holes corresponding to the respective connection ports 105 of the hard disk accommodating structures 10 for the connection ports 105 to be electrically connected to the circuit components provided on the retaining member.

The door covers 12 correspond to the front openings 101 of the hard disk accommodating structures 10, respectively. One end of the door cover 12 is pivotally connected to the connecting side portion 103 so that the door cover 12 is pivotable relative to the connecting side portion 103.

The connecting rod assemblies 13 are disposed in the respective hard disk accommodating structures 10 and each include a first rod 131 and a second rod 132. A first end of the first rod 131 is movably disposed in a slide hole 121, and a second end of the first rod 131 extends towards the retaining member 11 and has a pushing member 1311. A first end of the second rod 132 is pivotally connected to the first rod 131, and a second end of the second rod 132 is pivotally connected to the connecting side portion 103. Preferably, the first rod 131 and the second rod 132 may be, for example, a platy structure, so as to have better linkage performance and reduce the overall volume effectively. When the door cover 12 is opened, the first end of the first rod 131 is moved outwardly along the slide hole 121 in response to the movement of the door cover 12, and the pushing member 1311 at the second end of the first rod 131 is simultaneously moved outwardly, and the second rod 132 is pivoted in response to the movement of the first rod 131, and the door cover 12 is flush with the connecting side portion 103 so that the door cover 12 is fully opened.

Through the special structural design of the connecting rod assemblies 13, one door cover 12 after being opened does not interfere with the neighboring door cover 12, so that multiple door covers 12 can be opened at the same time, thereby improving the convenience of use greatly. Based on the above structural features, when the disk array enclosure 1 is disposed inside a casing, it may be close to the casing. Because the door cover 12 will be flush with the connecting side portion 103 when it is fully opened, so the casing will not affect the door cover 12 located on the side when it is opened. In this way, in addition to making the disk array enclosure less likely to be limited by the space of the casing during assembly, it is also more convenient to use. Besides, there is no need for the casing to expand its space due to the opening of the disk array enclosure 1. In addition, the second rod 132 helps the end having the pushing member 1311 of the first rod 131 to move more smoothly and stably. Because the second rod 132 has the first end pivoted to the first rod 131 and the second end pivoted to the connecting side portion 103, when the first rod 131 is displaced to pivot the second rod 132, the second end of the first rod 131, away from the door cover 12, can be supported when it is moved, so that it can be moved smoothly.

Preferably, the slide hole 121 is defined in an extension portion 122 on the top side of the door cover 12. Specifically, the extension portion 122 extends from the edge of the door cover 12, so as to simplify the structure of the door cover 12, and to allow the connecting rod assembly 13 to be operated in a way that stays on the top side of the overall structure, and to reduce the degree of obstruction when the hard disk is drawn. Further, the slide hole 121 may be a curved through hole extending from the door cover 12 towards the connecting side portion 103. When the door cover 12 is moved to be flush with the connecting side portion 103, the first end of the first rod 131 is located at one end of the slide hole 121 adjacent to the connecting side portion 103. Thus, the door cover 12 can be fully opened by a short displacement of the connecting rod assembly 13 when the door cover 12 is moved. Besides, the first rod 131 and the second rod 132 are close to the connecting side portion 103 after the door cover 12 is opened, thereby reducing the space occupied by the connecting rod assembly 13.

Furthermore, taking into account the movement of the first rod 131 and the relative linkage of the second rod 132, preferably, the first rod 131 has a first section 1312 and a second section 1313 that are arranged in sequence. One end of the first section 1312 is movably disposed in the slide hole 121, and the other end of the first section 1312 has a first curved portion 1314 that is concave. One end of the second section 1313 has the pushing member 1311, and the other end of the second section 1315 has a second curved portion 1315 that is convex. The second curved portion 1315 is connected to the first curved portion 1314. The first end of the second rod 132 is pivotally connected to the junction of the first curved portion 1314 and the second curved portion 1315. In this way, when the first rod 131 is moved by the door cover 12, the displacement and pivoting of the first rod 131 and the second rod 132 can be stabilized by this structural design.

The hard disk 2 generates heat during operation, and the heat may affect or even damage the hard disk 2 due to overheating. Considering the demand for heat dissipation after the hard disk 2 is installed in the corresponding hard disk accommodating structure 10, preferably, the retaining member 11 is formed with a plurality of first perforations 111. This helps the heat generated by the hard disk 2 to dissipate outwardly from the first perforations 111. Further, in order to enhance the heat dissipation efficiency, the door cover 12 is formed with a plurality of second perforations 123, so that the heat generated by the hard disk 2 can be dissipated from the front and the back of the hard disk accommodating structure 10. The hard disk accommodating structure 10 is formed with an air flow channel, thereby improving the heat dissipation effect.

In order to make the heat dissipation more reliable and to consider the convenience of the manufacturing process, the first perforations 111 and the second perforations 123 are arranged in a staggered manner, thereby improving the heat dissipation effect. With this structural configuration, the retaining member 11 and the door cover 12 have better structural rigidity.

Preferably, the retaining member 11 has a first plate portion 112, a second plate portion 113 and a third plate portion 114. The first plate portion 112 and the third plate portion 114 are vertically connected to two opposite sides of the second plate portion 113, respectively. The second plate portion 113 corresponds in position to the rear openings 102 of the hard disk accommodating structures 10. The first plate portion 112 corresponds in position to the top sides of the hard disk accommodating structures 10. The third plate portion 114 corresponds in position to the bottom sides of the hard disk accommodating structures 10. The retaining member 11 has an approximately U-shaped structure, which improves the overall structural rigidity of the disk array enclosure 1. On the bottom side, the third plate portion 114 is configured to enhance the load-bearing capacity for the hard disk 2. On the top side, the first plate portion 112 is configured to enhance the assembly strength of the retaining member 11 and the hard disk accommodating structures 10.

When the retaining member 11 is in the form of the above structure, the second plate portion 113 and the third plate portion 114 are partially formed with the first perforation holes 111, which further enhances the overall heat dissipation effect.

Furthermore, considering the stability of the movement of the hard disks 2 in the disk array enclosure 1, in this embodiment, the hard disk accommodating structure 10 has the connection port 105 close to the rear opening 102, and the pushing member 1311 is located at the center of the connection port 105 when the door cover 12 is in a closed state. Through the structural feature of the pushing member 1311 located at the center of the connection port 105, the pushing member 1311 can push the hard disk 2 in response to the movement of the first rod 131, so that the force applied to the hard disk 2 when the hard disk 2 is disengaged from the connection port 105 is more uniform, reducing the chance of damage to the hard disk 2 due to the movement.

Furthermore, the disk array enclosure 1 further comprises a top plate 14 located on the top side of the hard disk accommodating structures 10. The top plate 14 has a plurality of connecting portions 141 for connection of the connecting side portions 103 of the hard disk accommodating structures 10. In order to enhance the overall structural stability and rigidity of the disk array enclosure 1, the disk array enclosure 1 further comprises the top plate 14 connected with the hard disk accommodating structures 10 to enhance the structural integrity. Alternatively, the top plate 14 may be connected with the retaining portions 104 of the hard disk accommodating structures.

Furthermore, in order to improve the alignment of the second end of the first rod 131 that has the pushing member 1311 after being installed and to consider the size of the disk array enclosure 1, the first plate portion 112 has a plurality of notches 1121 each corresponding in position to the second end of the first rod 131 that has the pushing member 1311. In this way, the retaining member 11 does not need to be moved backward due to the first rod 131, resulting in an increase in the volume of the disk array enclosure 1. The retaining member 11 does not need to be set backward due to the first rod 131, resulting in an increase in the volume of the hard disk extraction device 1. The notch 1121 is beneficial for the second end of the first rod 131 that has the pushing member 1311 to be aligned with the retaining member 11 during the assembly of the components.

In order to control the opening and closing of the door cover 12, preferably, the door cover 12 has a mounting portion 124 and a switching element 125. The switching element 125 is disposed on the mounting portion 124 via a pivot 126. One end of the switching element 125 has a locking rib 1251, and the other end of the switching element 125 has a pulling portion 1252. The hard disk accommodating structure 10 has a locking hole 106 corresponding to the locking rib 1251. Preferably, the locking hole 106 may be formed on the retaining portion 104 opposite to the connecting side portion 103. When the door cover 12 is closed to cover the front opening 101, the locking rib 1251 is locked in the locking hole 106. When the pulling portion 1252 is pulled to move the switching element 125 outwardly, the switching element 125 is rotated about the pivot 126 as a rotation fulcrum to disengage the locking rib 1251 from the locking hole 106. Thus, in use, the door cover 12 can be moved by disengaging the locking rib 1251 from the locking hole 106 through the pulling portion 1252. When the door cover 12 is to be closed, a slight force will be applied so that the locking rib 1251 is engaged in the locking hole 106. Alternatively, through the pulling portion 1252 to move the locking rib 1251, after the door cover 12 is closed to cover the front opening 101, the pulling portion 1252 is released and the locking rib 1251 is locked in the locking hole 106 again.

Figure 4:
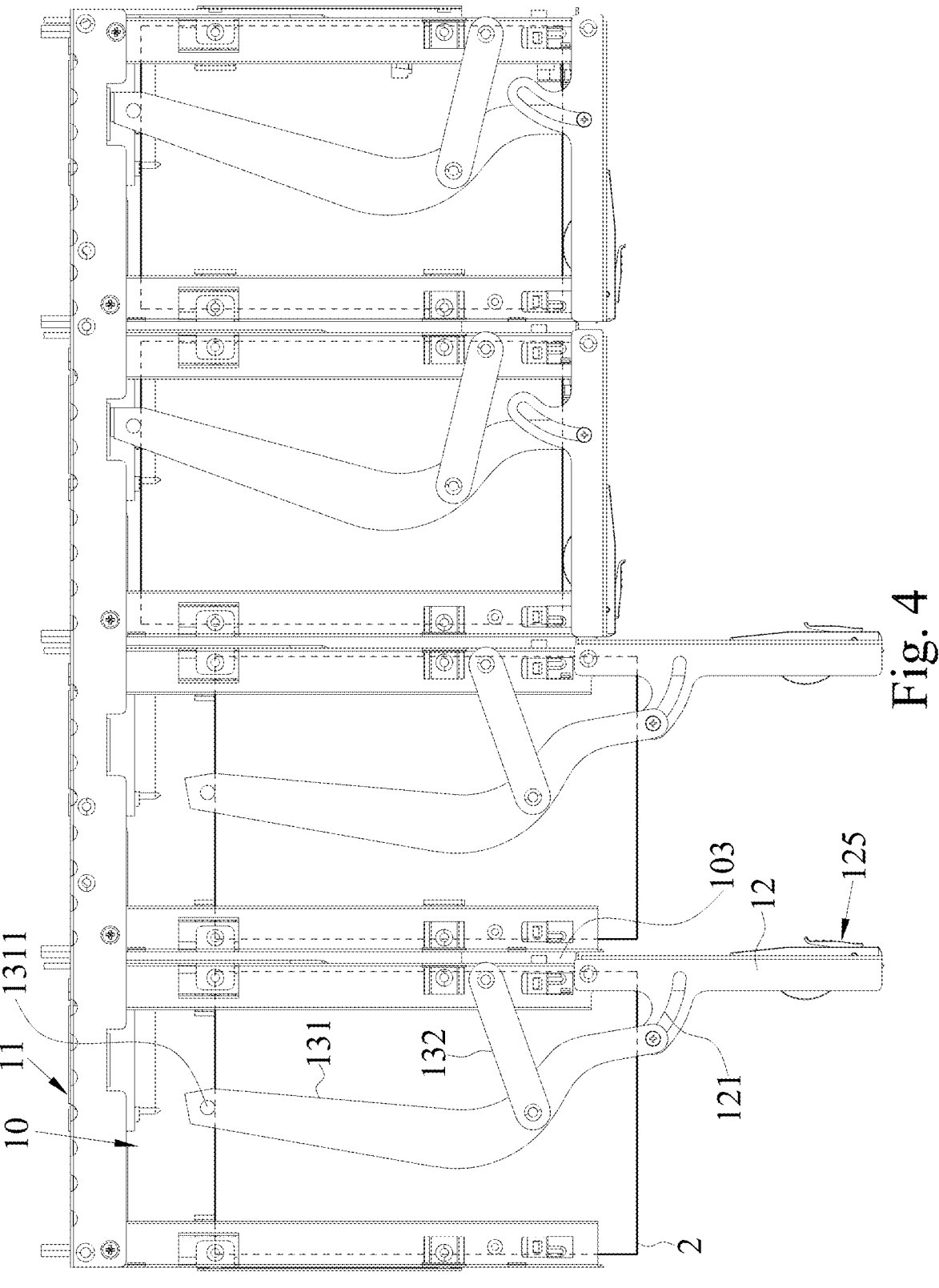
FIG. 4 is a second schematic view of the disk array enclosure according to the preferred embodiment of the present invention when in use.

When in use, the hard disks 2 are placed into the respective hard disk accommodating structures 10 from the respective front openings 101, and the connection ports of the hard disks 2 are connected to the connection ports 105 of the hard disk accommodating structures 10, and then the respective door covers 12 are closed to secure the hard disks 2. When the hard disk 2 is to be taken out, the pulling portion 1252 is pulled and pivoted to disengage the locking rib 1251 from the locking hole 106, and then the door cover 12 is opened. At this time, due to the slide hole 121, the first end of the first rod 131 is moved outwardly along the slide hole 121, and the second rod 132 is also moved. The pushing member 1311 of the first rod 131 moves outward simultaneously and pushes the rear end of the hard disk 2, so that the hard disk 2 is separated from the connection port 105 and moved outward. When the first end of the first rod 131 is moved to the end of the slide hole 121, the door cover 12 is fully opened, and the door cover 12 is flush with the connecting side portion 103 and does not cross over to another adjacent door cover 12, as shown in FIG. 4. In this way, multiple door covers 12 can be opened at the same time without interfering with each other when the hard disks 2 are to be taken out, and the same is true when the hard disks 2 are to be placed into the respective hard disk accommodating structures 10. In order to facilitate illustration of the connecting rod assemblies 13, the top plate 14 is not shown in FIG. 3 and FIG. 4.

In summary, the disk array enclosure provided by the present invention, through the special structure of the connecting rod assembly and the door cover, allows the door cover not to interfere with the neighboring door cover when the door cover is fully opened. Multiple door covers can be opened at the same time for placement or removal of the hard disks, thereby improving convenience of use greatly. With this structure, the hard disks are mounted inside the host well, avoiding the problem that the door cover of the hard disk accommodating structure on the side cannot be opened smoothly due to its close proximity to the casing. In other words, the disk array enclosure can be more adjustable when it is assembled in the host, so that its use will not be affected by the distance from the casing. Besides, the casing of the host no longer needs to be expanded to accommodate the disk array enclosure. Further, the present invention may provide a number of examples of structures that could be implemented. For example, with regard to a better structure of the door cover, it is possible to simplify the structure, reduce the volume, and facilitate the operation of the connecting rod assembly through the extension portion on the top side of the door cover; or, the door cover may be equipped with the switching element to facilitate quick opening and closing of the door cover; or, in view of the heat dissipation requirement of the actual application, the retaining member and the door cover have the first perforations and the second perforations, respectively. Considering the overall structural rigidity and strength of the disk array enclosure, the retaining member has the first, second, and third plates, and the top plate is provided to enhance the overall structural integrity, strength, and load-bearing capacity for the hard disk. On the other hand, in order to make the operation of the connecting rod assembly smoother or to reduce the possibility of damage to the hard disk when it is being pushed, the present invention also provides further examples of the structure of the first rod, and the pushing member is designed to be located at the center of the connection port of the hard disk accommodating structure.

What is claimed is:

1. A disk array enclosure, comprising:
   a plurality of hard disk accommodating structures for accommodating hard disks, the plurality of hard disk accommodating structures being arranged side by side, each of the plurality of hard disk accommodating structures having a front opening, a rear opening, and a connecting side portion, the connecting side portion being located on one side of the front opening and the rear opening;
   a retaining member mounted to one side of the plurality of hard disk accommodating structures and at a position corresponding to the rear openings of the plurality of hard disk accommodating structures;
   a plurality of door covers corresponding to the front openings of the plurality of hard disk accommodating structures, respectively, wherein one end of each of the plurality of door covers is pivotally connected to the connecting side portion so that each of the plurality of door covers is pivotable relative to the connecting side portion, and a top side of each of the plurality of door covers has a slide hole; and
   a plurality of connecting rod assemblies disposed in the plurality of hard disk accommodating structures, respectively, and each of the plurality of connecting rod assemblies including a first rod and a second rod, the first rod having a first end that is movably disposed in the slide hole and a second end that extends towards the retaining member and that has a pushing member, the second rod having a first end that is pivotally connected to the first rod and a second end that is pivotally connected to the connecting side portion, wherein, when a door cover, among the plurality of door covers, is opened, the first end of the first rod is moved outwardly along the slide hole in response to a movement of the door cover, and the pushing member at the second end of the first rod is simultaneously moved outwardly, and the second rod is pivoted in response to the movement of the first rod, the door cover is flush with the connecting side portion when the first end of the first rod is moved to one end of the slide hole, the first rod has a first section and a second section that are arranged in sequence, the first section has one end movably disposed in the slide hole and another end having a first curved portion that is concave, the second section has one end provided with the pushing member and another end having a second curved portion that is convex, the second curved portion is connected to the first curved portion, and the first end of the second rod is pivotally connected to a junction of the first curved portion and the second curved portion.

2. The disk array enclosure according to claim 1, wherein the slide hole is defined in an extension portion on the top side of each of the plurality of door covers, and the extension portion extends from an edge of each of the plurality of door covers.

3. The disk array enclosure according to claim 1, wherein the retaining member is formed with a plurality of first perforations.

4. The disk array enclosure according to claim 3, wherein each of the plurality of door covers is formed with a plurality of second perforations.

5. The disk array enclosure according to claim 4, wherein the plurality of first perforations and the plurality of second perforations are arranged in a staggered manner.

6. The disk array enclosure according to claim 5, wherein the retaining member has a first plate portion, a second plate portion, and a third plate portion, the first plate portion and the third plate portion are vertically connected to two opposite sides of the second plate portion, respectively, the second plate portion is located at a position corresponding to the rear openings of the plurality of hard disk accommodating structures, the first plate portion is located at a position corresponding to top sides of the plurality of hard disk accommodating structures, and the third plate portion is located at a position corresponding to bottom sides of the plurality of hard disk accommodating structures.

7. The disk array enclosure according to claim 6, wherein the plurality of first perforation holes is arranged at the second plate portion and a portion of the third plate portion.

8. The disk array enclosure according to claim 7, wherein the slide hole is a curved through hole extending from each of the plurality of door covers towards the connecting side portion.

9. The disk array enclosure according to claim 8, wherein the first plate portion has a plurality of notches, each at a position corresponding to the second end of the first rod that has the pushing member.

10. The disk array enclosure according to claim 1, wherein each of the plurality of hard disk accommodating structures has a connection port close to the rear opening, and the pushing member is located at a center of the connection port when the door cover is in a closed state.

11. The disk array enclosure according to claim 10, further comprising a top plate provided on a top side of the plurality of hard disk accommodating structures, wherein the top plate has a plurality of connecting portions for connecting the connecting side portions of the plurality of hard disk accommodating structures.

12. The disk array enclosure according to claim 11, wherein each of the plurality of door covers has a mounting portion and a switching element, the switching element is disposed on the mounting portion via a pivot, one end of the switching element has a locking rib, another end of the switching element has a pulling portion, each of the plurality of hard disk accommodating structures has a locking hole corresponding to the locking rib, when the door cover is closed to cover the front opening, the locking rib is locked in the locking hole, and when the pulling portion is pulled to move the switching element outwardly, the switching element is rotated about the pivot as a rotation fulcrum to disengage the locking rib from the locking hole.

* * * * *